United States Patent
Shields et al.

(10) Patent No.: US 6,630,288 B2
(45) Date of Patent: *Oct. 7, 2003

(54) PROCESS FOR FORMING SUB-LITHOGRAPHIC PHOTORESIST FEATURES BY MODIFICATION OF THE PHOTORESIST SURFACE

(75) Inventors: Jeffrey A. Shields, Sunnyvale, CA (US); Uzodinma Okoroanyanwu, Mountain View, CA (US); Chih-Yuh Yang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 2 days.

This patent is subject to a terminal disclaimer.

(21) Appl. No.: 09/819,342

(22) Filed: Mar. 28, 2001

(65) Prior Publication Data

US 2002/0160320 A1 Oct. 31, 2002

(51) Int. Cl.$^7$ .............................. G03F 7/00; G03F 7/20; H01L 21/30
(52) U.S. Cl. ...................... 430/313; 430/296; 430/312; 430/942
(58) Field of Search ................. 430/296, 311, 430/312, 322, 328, 313, 942

(56) References Cited

U.S. PATENT DOCUMENTS

| | | | | |
|---|---|---|---|---|
| 3,997,367 A | | 12/1976 | Yau .............................. 148/1.5 |
| 5,003,178 A | | 3/1991 | Livesay ..................... 250/492.3 |
| 5,468,595 A | | 11/1995 | Livesay ........................ 430/296 |
| 5,658,469 A | * | 8/1997 | Jennison ...................... 428/611 |
| 5,876,903 A | | 3/1999 | Ng et al. ...................... 430/313 |
| 5,962,195 A | * | 10/1999 | Yen et al. .................... 430/316 |
| 5,965,461 A | * | 10/1999 | Yang et al. .................. 438/717 |
| 5,994,225 A | | 11/1999 | Liu et al. |
| 6,103,457 A | | 8/2000 | Gabriel ........................ 430/318 |
| 6,107,172 A | * | 8/2000 | Yang et al. .................. 438/585 |
| 6,110,837 A | | 8/2000 | Linliu et al. ................. 438/723 |
| 6,174,818 B1 | * | 1/2001 | Tao et al. .................... 438/733 |
| 6,197,687 B1 | | 3/2001 | Buynoski ..................... 438/671 |
| 6,232,048 B1 | | 5/2001 | Buynoski et al. ........... 430/328 |
| 6,319,655 B1 | * | 11/2001 | Wong et al. ................. 430/311 |
| 6,358,670 B1 | * | 3/2002 | Wong et al. ................. 430/296 |

OTHER PUBLICATIONS

"Plasma–Enhanced etching and Deposition", D.W.Hess and D.B.Graves in Microelectronic Processing, (Eds.: D.W.Hess & K.F.Jensen) ACS (1989), ch.8 pp. 377–440.*

Livesay, W. R., "*Large–area electron–beam source,*" Journal of Vacuum Science & Technology B, vol. 11, No. 6, Nov./Dec. 1993, pp. 2304–2308, American Vacuum Society.

Yang, J. J. et al, "*Electron Beam Processing for Spin–on Polymers and its Applications to Back–End–of–Line (BEOL) Integration,*" Materials Research Society Symposium Proceedings, vol. 511, 1998, pp. 49–55, Materials Research Society.

Ross et al, "*Plasma Etch Characteristics of Electron Beam Processed Photoresist,*" The Society of Photo–Optical Instrumentation Engineers, vol. 2438, 1995, pp. 803–816, SPIE–The International Society for Optical Engineering.

(List continued on next page.)

Primary Examiner—Mark F. Huff
Assistant Examiner—Kripa Sagar
(74) Attorney, Agent, or Firm—Foley & Lardner

(57) ABSTRACT

A process for forming sub-lithographic features in an integrated circuit is disclosed herein. The process includes modifying a photoresist layer after patterning and development but before it is utilized to pattern the underlying layers. The modified photoresist layer has different etch rates in the vertical and horizontal directions. The modified photoresist layer is trimmed with a plasma etch. A feature included in the trimmed photoresist layer has a sub-lithographic lateral dimension.

15 Claims, 3 Drawing Sheets

OTHER PUBLICATIONS

Grün, Von A. E., "*Lumineszenz–photometrische Messungen der Energieabsorption im Strahlungsfeld von Elektronenquellen Eindimensionaler Fall in Luft*," Zeitschrift für Naturforschung, vol. 12a, 1957, pp. 89–95, Publisher: Zeitschrift für Naturforschung; full English Translation attached (11 pgs.).

Chiong K.G. et al. "Resist Contrast Enhancement in High Resolution Electron Beam Lithography", Journal of Vacuum Science and Technology: Part B, American Institute of Physics, New York, US, vol. 7, No. 6.

Patent Abstracts of Japan, vol. 1999, No. 9, Jul. 30, 1999 & JP 11 097328 A (Toshiba Corp), Apr. 9, 1999 abstract.

* cited by examiner

PROCESS FOR FORMING SUB-LITHOGRAPHIC PHOTORESIST FEATURES BY MODIFICATION OF THE PHOTORESIST SURFACE

CROSS REFERENCE TO RELATED APPLICATIONS

The present application is related to U.S. application Ser. No. 09/819,692 by Okoroanyanwu et al., entitled "Process for Preventing Deformation of Patterned Photoresist Features by Electron Beam Stabilization;" U.S. application Ser. No. 09/820,143 by Okoroanyanwu et al., entitled "Improving SEM Inspection and Analysis of Patterned Photoresist Features;" U.S. application Ser. No. 09/819,344 by Okoroanyanwu et al., entitled "Process for Reducing the Critical Dimensions of Integrated Circuit Device Features;" U.S. application Ser. No. 09/819,343 by Gabriel et al., entitled "Selective Photoresist Hardening to Facilitate Lateral Trimming;" and U.S. application Ser. No. 09/819,552 by Gabriel et al., entitled "Process for Improving the Etch Stability of Ultra-Thin Photoresist," all filed on an even date herewith and assigned to the Assignee of the present application.

FIELD OF THE INVENTION

The present invention relates generally to integrated circuit (IC) fabrication. More particularly, the present invention relates to fabrication of IC features having sub-lithographic lateral dimensions using modified photoresist surfaces.

BACKGROUND OF THE INVENTION

The semiconductor or integrated circuit (IC) industry aims to manufacture ICs with higher and higher densities of devices on a smaller chip area to achieve greater functionality and to reduce manufacturing costs. This desire for large scale integration requires continued shrinking of circuit dimensions and device features. The ability to reduce the size of structures, such as, gate lengths in field-effect transistors and the width of conductive lines, is driven by lithographic performance.

IC fabrication techniques often utilize a photomask (also referred to as a mask) or a reticle. Radiation is provided through or reflected off the mask or reticle to form an image on a semiconductor wafer. Generally, the image is projected and patterned onto a layer of material, such as, photoresist material, on the wafer. In turn, the patterned photoresist material is utilized to define doping regions, deposition regions, etching regions, and/or other structures of the IC. The patterned photoresist material can also define conductive lines or conductive pads associated with metal layers of the IC. Further, the patterned photoresist material can define isolation regions, transistor gates, or other device structures and elements.

To transfer an image or pattern onto the photoresist material, lithography systems include a light source configured to provide electromagnetic radiation or light at one or more wavelengths. The light source may produce radiation at a wavelength of 365 nanometers (nm), 248 nm, and/or 193 nm. The photoresist material patterned by such radiation is selected to be responsive to the wavelength of such radiation. Preferably, the areas of the photoresist material upon which radiation is incident undergo a photochemical change such that it becomes suitably soluble or insoluble in a subsequent developing process step.

As IC device dimensions continue to shrink, it becomes necessary to define dimensions that are smaller than possible using conventional lithographic techniques. One method for achieving sub-lithographic device dimensions is by reducing or "trimming" features defined on the patterned photoresist material before such features are patterned onto the underlying layer(s). This method, commonly referred to as a resist trim or trimming process, utilizes a plasma etch to remove some of the patterned photoresist material such that the dimensions of the trimmed features are smaller than the original lithographically patterned features using the mask or reticle. In a conventional resist trimming process, the plasma bombards all surfaces of the patterned photoresist material, such that top surfaces as well as side or lateral surfaces of the patterned photoresist material are etched. Hence, as the trimming time is increased (i.e., the patterned photoresist material is exposed to the plasma etch for a longer period of time) to further reduce lateral dimensions (i.e., further etch the side surfaces, thereby reducing the width of features, such as, contact lines), the thickness of the patterned photoresist material is also reduced (due to erosion of its top surfaces). Unfortunately, with enough thinning of the patterned photoresist material, there may not be enough photoresist thickness remaining to survive or with which to perform subsequent processes, such as pattern transfer to underlying layer(s) via an etch process.

To combat such photoresist thinning problems, a thicker layer of photoresist material may be utilized. Although thicker photoresist material addresses the resist thinning that occurs during the trimming process, thicker photoresist material are susceptible to pattern deformation and/or incomplete pattern transfer. Because the resolution of features is, in part, proportional to the inverse of the exposure or lithographic wavelength, it is desirable to pattern photoresist material using shorter exposure wavelengths (e.g., 157 nm, 126 nm, or 13.4 nm). Presently, no photoresist materials exist that are specifically suited for such shorter exposure wavelengths. Instead, photoresist materials conventionally used in 265 nm, 248 nm, or 193 nm lithography are utilized. These longer wavelength photoresist materials exhibit high optical absorption per unit thickness at the shorter exposure wavelengths. Hence, the longer wavelength photoresist materials are increasingly opaque to shorter wavelength radiation and the necessary photochemical change does not occur throughout the entire thickness of the material. As the photoresist material thickness is increased, incomplete pattern transfer throughout the entire thickness of the material is more likely to occur.

Alternatively, even if complete pattern transfer has occurred, prolonged trimming (to achieve very narrow features in the patterned photoresist material) can cause pattern deformation, such as, pattern collapse, pattern bending, or pattern breakage. Since pattern deformation of a given patterned feature is a function of its aspect ratio (i.e., the ratio of the height vs. the width of the patterned feature), a thicker photoresist material will more likely result in pattern deformation. Thus, using a conventional thickness of photoresist material allows for less lateral trimming due to vertical consumption concerns. Namely, since the plasma etch also thins the photoresist as it narrows the patterned features, the trimming process must be stopped before maximum lateral reduction has been achieved to ensure that a thick enough layer of patterned photoresist material remains for subsequent processes (e.g., etch processes for pattern transfer to underlying layer(s), such as a polysilicon gate formation). On the other hand, starting with a thicker layer of photoresist material to permit prolonged trimming is also problematic due to incomplete pattern transfer and/or pattern deformation concerns.

Thus, there is a need for a process for permitting a conventional photoresist trimming process to be utilized to its maximum potential. There is a further need for a process for laterally trimming patterned features on a photoresist material without such photoresist material having associated therewith pattern deformation, incomplete pattern transfer, or insufficient vertical thickness for subsequent lithographic processes. Even further still, there is a need for a process for forming sub-lithographic photoresist features without extensive modification to conventional lithographic techniques, tools, materials, or equipment or significantly decreasing throughout.

BRIEF SUMMARY OF THE INVENTION

One exemplary embodiment relates to a method of trimming a feature patterned on a photoresist layer. The photoresist layer is disposed over a substrate and the feature includes a top portion and lateral surfaces. The method includes modifying the top portion of the feature patterned on the photoresist layer to form a modified top portion. The method further includes trimming the feature patterned on the photoresist layer to form a trimmed feature. A vertical trim rate and a lateral trim rate are associated with the feature. The vertical trim rate is slower than the lateral trim rate due to the modified top portion.

Another exemplary embodiment relates to an integrated circuit fabrication process. The process includes developing a patterned photoresist layer, and modifying the patterned photoresist layer to form a top portion and a bottom portion of the at least one feature. The patterned photoresist layer includes at least one feature. The top portion has a top etch rate and the bottom portion has a bottom etch rate. The top etch rate is different from the bottom etch rate. The process further includes etching the patterned photoresist layer to change the at least one feature to have a sub-lithographic lateral dimension and a sufficient vertical thickness to maintain pattern integrity.

Still another exemplary embodiment relates to an integrated circuit having a feature of sub-lithographic dimension. The feature is formed by the process including patterning the feature on a photoresist layer disposed over a substrate, developing the feature patterned on the photoresist layer, and changing at least a portion of the photoresist layer. The feature is patterned in accordance with a radiation at a lithographic wavelength and a pattern provided on a mask or a reticle. A top portion of the feature patterned on the photoresist layer is changed to have a different etch rate from a bottom portion of the feature patterned on the photoresist layer. The process further includes trimming the feature patterned on the photoresist layer to a sub-lithographic dimension, and transferring the trimmed feature patterned on the photoresist layer to the substrate. The feature in the substrate has the sub-lithographic dimension.

BRIEF DESCRIPTION OF THE DRAWINGS

The exemplary embodiments will become more fully understood from the following detailed description, taken in conjunction with the accompanying drawings, wherein like reference numerals denote like elements, in which.

DETAILED DESCRIPTION OF THE EXEMPLARY EMBODIMENTS

Figure 1:
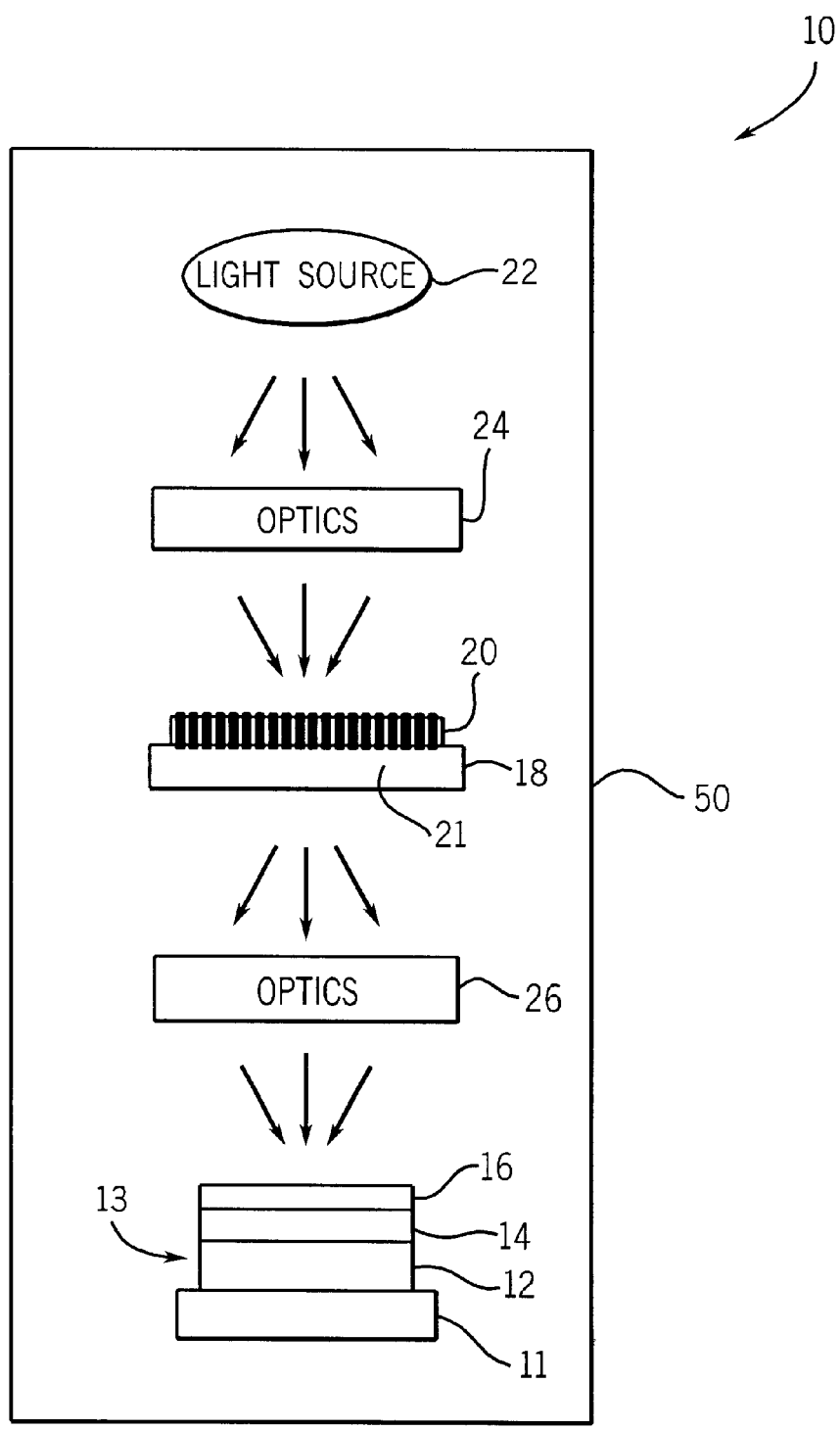
FIG. 1 is a general schematic block diagram of a lithographic system for patterning a wafer in accordance with an exemplary embodiment.

Referring to FIG. 1, there is shown a wafer 13 in a lithographic system 10. Lithographic system 10 includes a chamber 50, a light source 22, a condenser lens assembly 24, a mask or a reticle 18, an objective lens assembly 26, and a stage 11. Lithographic system 10 is configured to transfer a pattern or image provided on mask or reticle 18 to wafer 13. Lithographic system 10 may be a lithographic camera or stepper unit. For example, lithographic system 10 may be a PAS 5500/900 series machine manufactured by ASML, a microscan DUV system manufactured by Silicon Valley Group, or an XLS family microlithography system manufactured by Integrated Solutions, Inc. of Korea.

Wafer 13 includes a substrate 12, a layer 14, and a photoresist layer 16. Photoresist layer 16 is disposed over layer 14, and layer 14 is disposed over substrate 12. Wafer 13 can be an entire integrated circuit (IC) wafer or a part of an IC wafer. Wafer 13 can be a part of an IC, such as, a memory, a processing unit, an input/output device, etc. Substrate 12 can be a semiconductor substrate, such as, silicon, gallium arsenide, germanium, or other substrate material. Substrate 12 can include one or more layers of material and/or features, such as lines, interconnects, vias, doped regions, etc., and can further include devices, such as, transistors, microactuators, microsensors, capacitors, resistors, diodes, etc.

Layer 14 can be an insulative layer, a conductive layer, a barrier layer, or other layer of material to be etched, doped, or layered. In one embodiment, layer 14 can comprise one or more layers of materials, such as, a polysilicon stack comprised of a plurality of alternating layers of organic or inorganic anti-reflective coating (ARC) over doped or undoped polysilicon. In another embodiment, layer 14 is a hard mask layer, such as, a silicon nitride layer or a metal layer. The hard mask layer can serve as a patterned layer for processing substrate 12 or for processing a layer upon substrate 12. In yet another embodiment, layer 14 is an anti-reflective coating (ARC). Substrate 12 and layer 14 are not described in a limiting fashion, and can each comprise a conductive, semiconductive, or insulative material.

Photoresist layer 16 can comprise a variety of photoresist chemicals suitable for lithographic applications. Photoresist layer 16 is selected to have photochemical reactions in response to electromagnetic radiation emitted from light source 22. Materials comprising photoresist layer 16 can include, among others, a matrix material or resin, a sensitizer or inhibitor, and a solvent. Photoresist layer 16 is preferably a chemically amplified, positive or negative tone, organic based photoresist. For example, photoresist layer 16 may comprise PAR700 photoresist manufactured by Sumitomo Chemical Company. Photoresist layer 16 is deposited, for example, by spin-coating over layer 14. Photoresist layer 16 is provided at a thickness of less than 1.0 $\mu$m.

Chamber 50 of lithographic system 10 can be a vacuum or low pressure chamber for use in vacuum ultraviolet (VUV) lithography. Chamber 50 can contain any of numerous types of atmospheres, such as, nitrogen, etc.

Alternatively, lithographic system 10 can be utilized in various other types of lithography including lithography that uses electromagnetic radiation at any number of wavelengths.

Light source 22 provides light or electromagnetic radiation through condenser lens assembly 24, mask or reticle 18, and objective lens assembly 26 to photoresist layer 16. Light source 22 is an excimer laser, in one embodiment, having a wavelength of 365 nm, 248 nm, 193 nm, or 157 nm. Alternatively, light source 22 may be a variety of other light sources capable of emitting radiation having a wavelength in the ultraviolet (UV), vacuum ultraviolet (VUV), deep ultraviolet (DUV), or extreme ultraviolet (EUV) range.

Assemblies 24 and 26 include lenses, mirrors, collimators, beam splitters, and/or other optical components to suitably focus and direct a pattern of radiation (i.e., radiation from light source 22 as modified by a pattern or image provided on mask or reticle 18) onto photoresist layer 16. Stage 11 supports wafer 13 and can move wafer 13 relative to assembly 26.

Mask or reticle 18 is a binary mask in one embodiment. Mask or reticle 18 includes a translucent substrate 21 (e.g., glass or quartz) and an opaque or patterned layer 20 (e.g., chromium or chromium oxide) thereon. Opaque layer 20 provides a pattern or image associated with a desired circuit pattern, features, or devices to be projected onto photoresist layer 16. Alternatively, mask or reticle 18 may be an attenuating phase shift mask, an alternating phase shift mask, or other type of mask or reticle.

Figure 2:
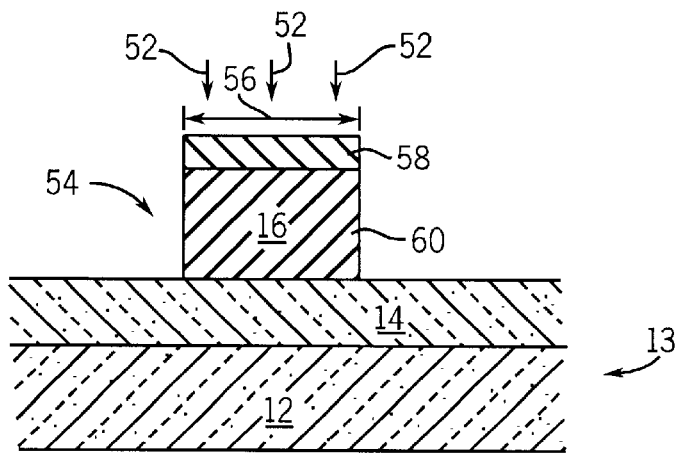
FIG. 2 is a schematic cross-sectional view of the wafer illustrated in FIG. 1, showing an electron beam curing step.

Utilizing lithographic system 10, the pattern or image on mask or reticle 18 is patterned on photoresist layer 16. After the patterned photoresist layer 16 is developed but before such a pattern is transferred onto any of the underlying layers, such as, layer 14, an electron beam exposure step is performed, as shown in FIG. 2. It should be understood that wafer 13 may be removed from chamber 50 and positioned within a different chamber and/or a different environment with tools, such as a flood electron beam source (not shown), for this electron beam exposure step.

In the electron beam exposure step, also referred to as an electron beam curing step or a resist curing step, wafer 13 is flood exposed with an electron beam 52. In FIG. 2, a cross-sectional view of a portion of wafer 13, and in particular a line feature 54 patterned on layer 16, is shown undergoing the curing process. In one embodiment, line feature 54 has an initial or nominal lateral dimension 56 of approximately 150 nm for an 193 nm lithographic system 10.

Electron beam 52 is preferably emitted from an extended area electron source (not shown) and is a uniform collimated beam that is flood exposed over the entire wafer 13. The extended area electron source is of the cold cathode type and generates electron beam 52 from the energetic impact of ions. An example of an extended area electron source suitable to generate electron beam 52 is manufactured by Electron Vision Corporation.

When electron beam 52 of sufficient energy comes into contact with molecules comprising the polymer material of layer 16, such molecules undergo a chemical reaction, i.e., cross-linking, to the extent that the functional groups of the polymer material associated therewith are completely decomposed. The portion of line feature 54 that has become completely decomposed is shown cross-hatched and comprises a top portion 58 (FIG. 2). The portion of line feature 54 that electron beam 52 is unable to penetrate or bombard, i.e., a bottom portion 60, remains unaffected (i.e., the polymer functional groups in bottom portion 60 are not cross-linked to the point of complete decomposition). Bottom portion 60 is disposed directly below top portion 58.

Top portion 58 has different electrical, optical, and material properties relative to bottom portion 60. Complete decomposition of the functional groups of the polymer material causes the electrical and optical properties of top portion 58 to be different, increases the density of top portion 58, and decreases the porosity of top portion 58 relative to bottom portion 60. Cured top portion 58 has greater etch resistance (or, equivalently, a slower erosion or etch rate) than uncured bottom portion 60. Hence, in a resist trimming step (FIGS. 3–4) following the electron beam exposure or curing step (FIG. 2), a greater amount of lateral trimming of features on layer 16 (e.g., line feature 54) can occur without adversely thinning layer 16 than is conventionally possible.

Figure 3:
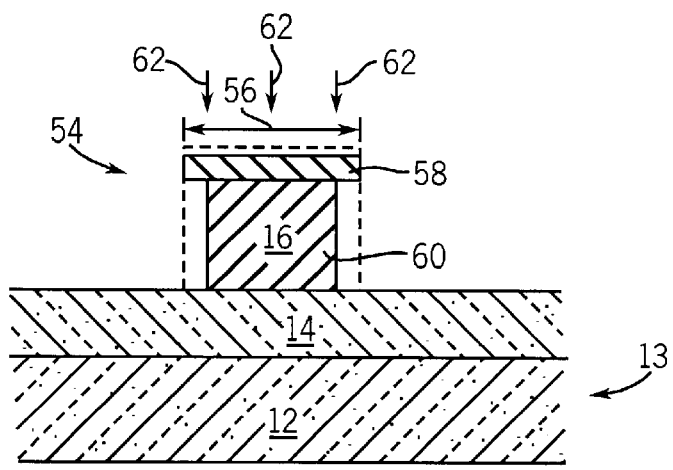
FIG. 3 is a schematic cross-sectional view of the wafer illustrated in FIG. 2, showing a partial resist trimming step.

In FIG. 3, a cross-sectional view of a portion of wafer 13 during the resist trimming step is shown. The resist trimming step is preferably a plasma etching step. Wafer 13 is exposed to a plasma etchant 62 to trim or reduce the dimensions of features patterned on layer 16. Plasma etchant 62 can comprise a variety of plasma etch chemistries, such as, $O_2$, $HBr/O_2$, or $Cl_2/O_2$. In one embodiment, wafer 13 is in a different processing environment (e.g., different chamber) than for the electron beam curing step of FIG. 2. A variety of standard etch systems, such as those manufactured by Applied Materials of Santa Clara, Calif., or Lam Research of Fremont, Calif., may be utilized to provide plasma etchant 62.

Plasma etchant 62 etches all exposed surfaces on layer 16, including the top and side surfaces. However, because different portions of layer 16 have different etch rates following the electron beam curing step (e.g., top portion 58 vs. bottom portion 60), the dimensional reduction of all of the surfaces of layer 16 will not be the same. As shown in FIG. 3, the vertical reduction of line feature 54 is less than the lateral reduction of line feature 54. Specifically, top portion 58 trims vertically at a slower rate than the sides of bottom portion 60, temporarily making line feature 54 a "T" shaped feature. The dotted line in FIG. 3 represents the shape of line feature 54 before commencement of the resist trimming step.

Preferably, the thickness of top portion 58 is selected such that substantially all of top portion 58 will be consumed or etched away simultaneous with the completion of a desired amount of lateral trimming of bottom portion 60. The thickness of top portion 58 is determined by the penetration depth of electron beam 52 into layer 16. By varying the energy, accelerating voltage, or current of electron beam 52 and/or the processing gas or wafer temperature associated with the electron beam curing step, it is possible to control the penetration depth of electron beam 52 into layer 16, or in other words, select the thickness of top portion 58. As an approximation, the thickness of top portion 58 is a function of the accelerating voltage of electron beam 52 and the relationship can be expressed as:

$$R_g = \frac{0.046 V_a^{1.75}}{d}$$

where $R_g$ is the penetration depth in microns, $V_a$ is the accelerating voltage or energy in keV, and d is the density of the target material (e.g., layer 16) in $g/cm^3$.

The erosion or etch rate of the cured portion of layer 16 is determined by the dose of electron beam 52. When layer 16 has been cured with electron beam 52 having a dose of approximately 1000 $\mu C/cm^2$, the etch rate of the cured portion of layer 16 (e.g., top portion 58) using a polysilicon etch or oxide etch plasma chemistry is approximately 35–50% slower than the uncured or untreated portion of layer 16 (e.g., bottom portion 60). A polysilicon etch typically includes the use of a $HBr/Cl_2/O_2$ or $HBr/O_2$ etch chemistries. An oxide etch typically includes the use of fluorine-based etch chemistries, such as $C_4F_8/Ar/O_2$.

Figure 6:
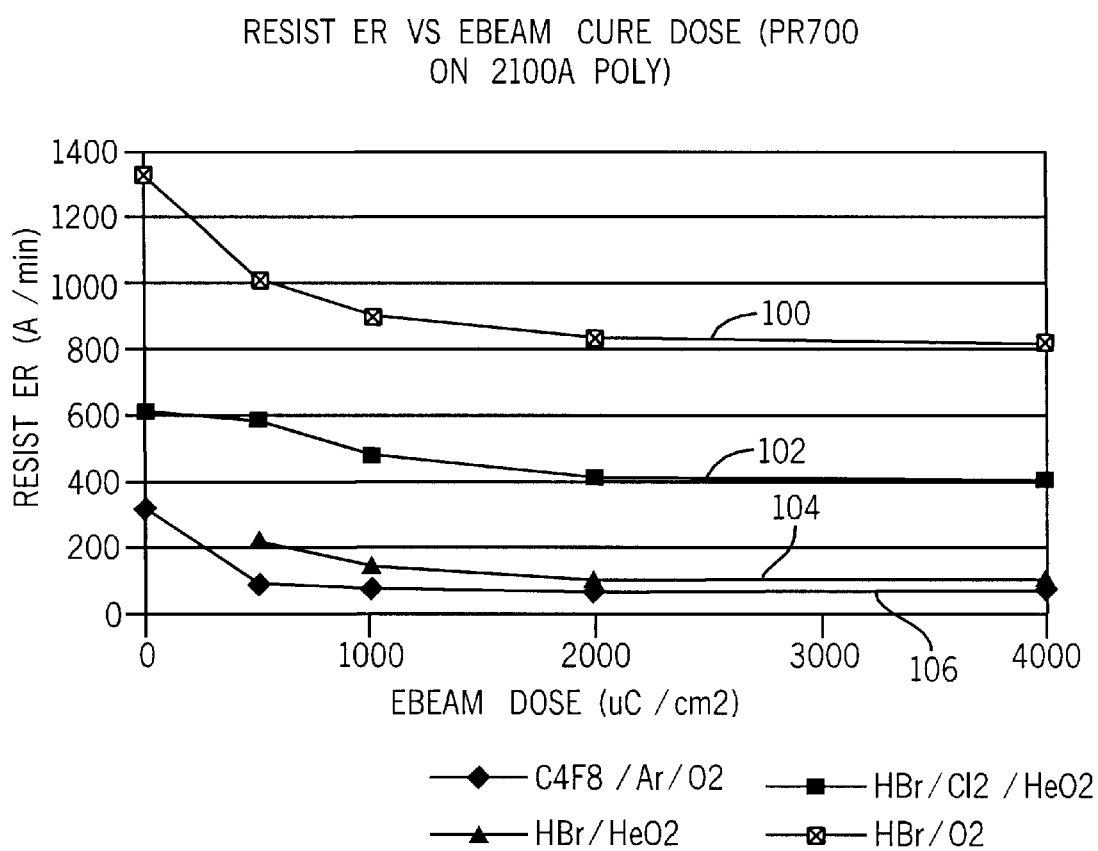
FIG. 6 is a plot showing the relative etch rates for photoresist material cured at varying doses of an electron beam for different etch chemistries.

The reduction in etch rate saturates for dose greater than approximately 2000 $\mu C/cm^2$. In FIG. 6, there is shown etch rates for PAR700 photoresist cured with various doses of the electron beam. The PAR700 photoresist in FIG. 6 is provided over a silicon substrate. Each of plot lines 100, 102, 104, and 106 shows the etch rate as a function of the dose of the electron beam. Plot line 100 represents the etch rate of the PAR700 photoresist when exposed to a $HBr/O_2$ etch chemistry. Plot line 102 represents the etch rate of the PAR700 photoresist when exposed to a $HBr/Cl_2/HeO_2$ etch chemistry. Plot line 104 represents the etch rate of the PAR700 photoresist when exposed to a $HBr/HeO_2$ etch chemistry. Plot line 106 represents the etch rate of the PAR700 photoresist when exposed to a $C_4F_8/Ar/O_2$ etch chemistry. In one embodiment, the etch chemistry parameters are as follows:

1. $HBr/O_2$ etch chemistry (plot line 100): 15 mT, source/bias of 100/20 W, and ratio of $HBr/O_2$=15/25 sccm.
2. $HBr/Cl_2/HeO_2$ etch chemistry (plot line 102): 20 mT, source/bias of 200/100 W, and ratio of $HBr/Cl_2/HeO_2$=150/30/15 sccm.
3. $HBr/HeO_2$ etch chemistry (plot line 104): 60 mT, source/bias of 200/90 W, and ratio of $HBr/HeO_2/He$=200/10/100 sccm.
4. $C_4F_8/Ar/O_2$ etch chemistry (plot line 106): 60 mT, 1700 W, and ratio of $C_4F_8/Ar/O_2$=7/500/2 sccm.

Figure 4:
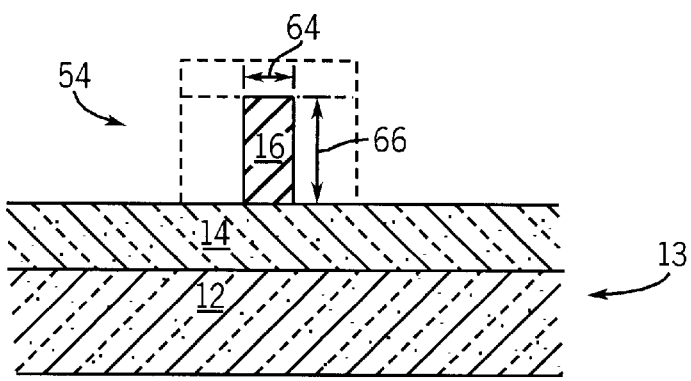
FIG. 4 is a schematic cross-sectional view of the wafer illustrated in FIG. 3, showing a full resist trimming step.

In FIG. 4, a cross-sectional view of a portion of wafer 13 upon completion of the resist trimming step (FIG. 3) is shown. Line feature 54 now comprises bottom portion 60 that has been laterally trimmed and top portion 58 is absent, having been completely etched by plasma etchant 62. Line feature 54 after the plasma etch has a trimmed lateral dimension 64 and a vertical thickness 66. For example, if initial or nominal lateral dimension 56 is 150 nm, then trimmed lateral dimension 64 can approach 70 nm or less and vertical thickness 66 can be in the range of 1000–6000 Å.

Conventionally, for 193 nm lithographically patterned features without electron beam curing, features having a nominal lateral dimension of about 150 nm cannot be trimmed to less than about 110 nm without the features disintegrating during subsequent processes, such as an etch process, (i.e., due to insufficient thickness of the remaining layer 16). In contrast, by modifying the top surface of layer 16 to slow the vertical resist thickness loss during the resist trimming step, the resultant features patterned on layer 16 can achieve trimmed lateral dimensions similar to those achievable with conventional resist trimming processes but with more resist thickness remaining. Alternatively, the resultant features patterned on layer 16 can comprise a resist thickness similar to those conventionally achievable but with narrower lateral dimensions. Having a greater thickness of resist remaining increases the probability that such trimmed features will survive subsequent processes to be faithfully patterned onto underlying layers.

Figure 5:
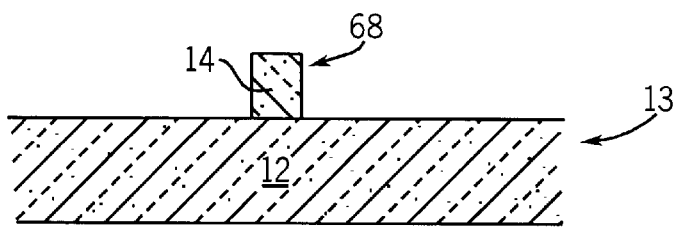
FIG. 5 is a schematic cross-sectional view of the wafer illustrated in FIG. 4, showing an etch step.

In FIG. 5, the trimmed line feature 54 shown in FIG. 4 is patterned onto layer 14 by an etching step. Sufficient vertical thickness 66 of line feature 54 permits the shape of line feature 54 (with the reduced lateral dimension) to survive subsequent lithographic processes, such as an etching step, to pattern feature 68 into layer 14. Feature 68 is shaped similar to line feature 54 and has a lateral dimension similar to trimmed lateral dimension 64. Feature 68 may be, but is not limited to, a conducting line, a transistor gate, an insulating line, etc.

In this manner, conventional photoresist materials, conventional photoresist thicknesses, and/or conventional resist trimming processes may be utilized to form integrated circuit (IC) features having significantly sub-lithographic dimensions without concerns of pattern deformation or destruction during pattern transfer to underlying layer(s). Moreover, a more aggressive resist trimming process is permitted (e.g., extended trimming time) before destruction of pattern integrity is likely to occur due to insufficient resist thickness. With an electron beam curing of the developed photoresist layer 16, the electron beam selected to have specific beam characteristics in accordance with desirable modification to the surface of photoresist layer 16, feature dimensions may approximately be reduced by half from those provided on mask or reticle 18.

It is also contemplated that the surface of layer 16 may be modified to slow vertical resist thickness loss during the resist trimming step by a variety of other treatments. For example, layer 16 may be exposed to an ultraviolet (UV) light after being patterned and developed but before being trimmed with a wavelength at which the material comprising layer 16 is opaque. In another example, layer 16 may be cured with an anisotropic plasma, such as, $N_2$, $H_2$, Ar, or various fluorine, chlorine or bromine containing gas mixtures. In still another example, layer 16 may be chemically treated before it is exposed to a developing solution, or layer 16 may be exposed to low energy implantation of $N_2$, B, P, As, etc.

It is understood that while the preferred embodiment and specific examples are given, they are for the purpose of illustration only and are not limited to the precise details described herein. Various modifications may be made in the details within the scope and range of the equivalence of the claims without departing from what is claimed.

What is claimed is:

1. A method of trimming a feature patterned on a photoresist layer, the photoresist layer disposed over a substrate and the feature including a top portion and lateral surfaces, the method comprising the steps of:
    modifying the top portion of the feature patterned on the photoresist layer to form a modified top portion; and
    trimming the feature patterned on the photoresist layer to form a trimmed feature, wherein a vertical trim rate and a lateral trim rate are associated with the feature and the vertical trim rate is slower than the lateral trim rate due to the modified top portion;
    wherein trimming the feature comprises reducing the width of a portion of the feature to a sub-lithographic dimension.

2. The method of claim 1, wherein the modifying step includes flood exposing the top portion to an electron beam.

3. The method of claim 2, wherein a vertical thickness of the modified top portion is a function of a current or an accelerating voltage of the electron beam.

4. The method of claim 2, wherein the modifying step includes substantially decomposing functional groups included in the material comprising the photoresist layer.

5. The method of claim 2, wherein the vertical trim rate is a function of a dose of the electron beam.

6. The method of claim 3, wherein the dose is in the range of approximately 1–2000 $\mu C/cm^2$.

7. The method of claim 1, further comprising etching the substrate according to the portion of the feature having a sub-lithographic dimension to form a feature in the substrate having a sub-lithographic dimension.

8. The method of claim 1, wherein the trimming step includes plasma etching the feature until the modified top portion has been consumed.

9. An integrated circuit fabrication process, the process comprising:

developing a patterned photoresist layer, the patterned photoresist layer including at least one feature;

modifying the patterned photoresist layer to form a top portion and a bottom portion of the at least one feature, the top portion having a top etch rate and the bottom portion having a bottom etch rate, wherein the top etch rate is different from the bottom etch rate; and etching the patterned photoresist layer such that the bottom portion has a sub-lithographic lateral dimension and a sufficient vertical thickness to maintain pattern integrity.

10. The process of claim 9, wherein modifying the patterned photoresist layer includes cross-linking the top portion to the extent that functional groups of the material comprising the top portion are decomposed.

11. The process of claim 10, wherein modifying the patterned photoresist layer includes flood exposing the patterned photoresist layer to an electron beam.

12. The process of claim 11, wherein etching the patterned photoresist layer includes consuming the top portion and laterally etching the bottom portion.

13. The process of claim 12, wherein the bottom portion comprises the at least one feature after the etching step, the bottom portion having the sub-lithographic lateral dimension and the sufficient vertical thickness to maintain pattern integrity.

14. The process of claim 12, further comprising selecting parameters associated with the electron beam to configure a thickness of the top portion.

15. The process of claim 12, further comprising selecting parameters associated with the electron beam to configure the top etch rate of the top portion.

* * * * *